United States Patent [19]
Peng

[11] Patent Number: 5,925,576
[45] Date of Patent: Jul. 20, 1999

[54] METHOD AND APPARATUS FOR CONTROLLING BACKSIDE PRESSURE DURING CHEMICAL MECHANICAL POLISHING

[75] Inventor: Cheng-An Peng, Ping-Tung, Taiwan

[73] Assignee: ProMOS Technologies, Inc., Hsinchu, Taiwan

[21] Appl. No.: 09/136,704

[22] Filed: Aug. 19, 1998

[51] Int. Cl.⁶ .................................................. H01L 21/00
[52] U.S. Cl. ............................................ 438/692; 156/345
[58] Field of Search ........................... 438/692; 156/345; 216/88, 89

[56] References Cited

U.S. PATENT DOCUMENTS 5,635,083  6/1997  Breivogel et al. ..................... 216/88
5,653,622  8/1997  Drill et al. ............................ 451/5
5,791,973  8/1998  Nishio .................................. 451/41

*Primary Examiner*—R. Bruce Breneman
*Assistant Examiner*—Alva C. Powell
*Attorney, Agent, or Firm*—Christensen O'Connor Johnson & Kindness PLLC

[57] ABSTRACT

A plug for plugging selected perforations in a carrier assembly used in a chemical mechanical polishing system for polishing semiconductor wafers is disclosed. The plug comprises a pressure-resistant portion; a bottom portion attached to the pressure-resistant portion; and a leak-resistant portion extending from the pressure-resistant portion, dimensioned to fit snugly into the bottom portion.

6 Claims, 4 Drawing Sheets

METHOD AND APPARATUS FOR CONTROLLING BACKSIDE PRESSURE DURING CHEMICAL MECHANICAL POLISHING

FIELD OF THE INVENTION

The present invention relates generally to systems for chemical mechanical polishing of semiconductor wafers, and more particularly to an apparatus and method for adjusting the distribution of backside pressure in chemical mechanical polishing systems.

BACKGROUND OF THE INVENTION

In the manufacture of integrated circuits, wafer surface planarity is of extreme importance. Chemical mechanical polishing (CMP) is being increasingly used for dielectric planarization and metal polishing processing steps.

Referring to FIG. 1, in a conventional CMP system 100, a wafer 102 whose top surface 104 is to be polished is held in an inverted position by a carrier assembly 106 and polishing arm 108. The wafer 102 is held in a position against a rotating polishing pad 110 which removes material from the top surface 104 of the wafer 102 from mechanical abrasion from the polishing pad 110 and particles in the slurry dispensed onto the polishing pad 110 through a slurry inlet 128, and from chemical action from the slurry on the polishing pad. Rotation of the polishing pad during the polishing process is caused by a motor 112, while rotation of the wafer is caused by another motor 114. In addition there is a periodic translation motion by the polishing arm 108 so as to use different portions of the polishing pad over time.

The carrier assembly 106 is a pneumatic carrier that is connected to a vacuum pump and air pressure pump assembly 120 via tubing (not shown) in the polishing arm 108. The pneumatic carrier includes a perforated steel plate 122 and a capture ring 124, which together hold a perforated carrier pad 126 and the wafer 102. When a wafer is first moved by an automated wafer transportation system 130 from a wafer transport tray 132 to the carrier assembly 106, a vacuum pump is coupled to the carrier assembly 106 so as to hold the wafer in place while the polishing arm moves the wafer into position adjacent the polishing pad 110. After the wafer is in position and polishing begins, backside pressure can be applied to the wafer by a downward movement of the polishing arm 108 and application of positive air pressure through the perforated metal carrier plate 122 and carrier pad 126.

Some difficult problems with the CMP process in the commercial manufacturing environment are maintaining a stable material removal rate and maintaining uniformity of material removal on each wafer when processing hundreds of wafers with a single polishing pad. One of the key parameters in improving uniformity is the control of backside pressure (sometimes called backpressure) and the distribution of backside pressure. Backside pressure is the pressure between the surface of the wafer to be polished and the polishing pad. Although a user of the CMP system can control the pressure exerted on the wafer, the user cannot adjust the distribution of the backside pressure.

In the prior art, the distribution of the backside pressure is fixed and is dependent on the perforations of the carrier plate 122 and the carrier pad 126. Conventionally, equipment vendors design the distribution of backside pressure through using dummy wafers (i.e., non-pattern wafers) and placing the perforations accordingly. To vary the distribution of the backside pressure, the user has to order a new carrier plate and carrier pad. The user must wait for the equipment vendor to design, manufacture and ship the new carrier plate and carrier pad. This can be costly and time-consuming as it adds to the down time of the CMP system.

Therefore, it would be advantageous to have a system and method for readily adjusting the distribution of the backside pressure.

SUMMARY OF THE INVENTION

A plug for plugging selected perforations in a carrier assembly used in a chemical mechanical polishing system for polishing semiconductor wafers is disclosed. The plug comprises a pressure-resistant portion; a bottom portion extending from the pressure-resistant portion; and a ring portion extending around the bottom portion, dimensioned to fit snugly into the selected perforation.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention will be described in detail with reference to the accompanying drawings. The present invention provides a plug used to plug selected perforations in a carrier of a chemical mechanical polishing (CmP) system for processing semiconductor wafers. By plugging selected perforations in the carrier, a user of the CMP system can readily adjust the distribution of the backside pressure to improve uniformity.

Figure 1:
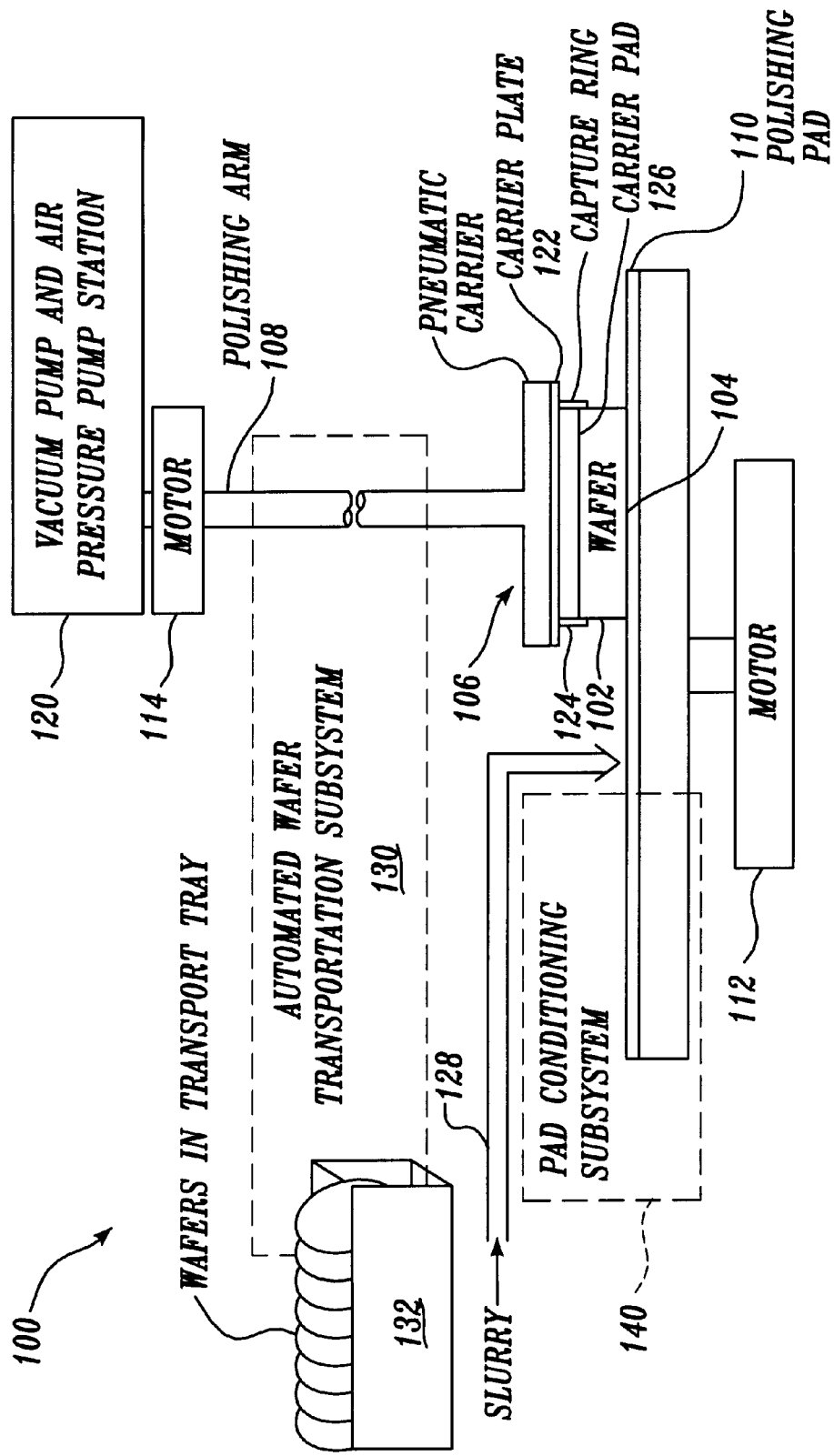
FIG. 1 is a schematic representation of a conventional chemical mechanical polishing system for processing semiconductor wafers.
Figure 2:
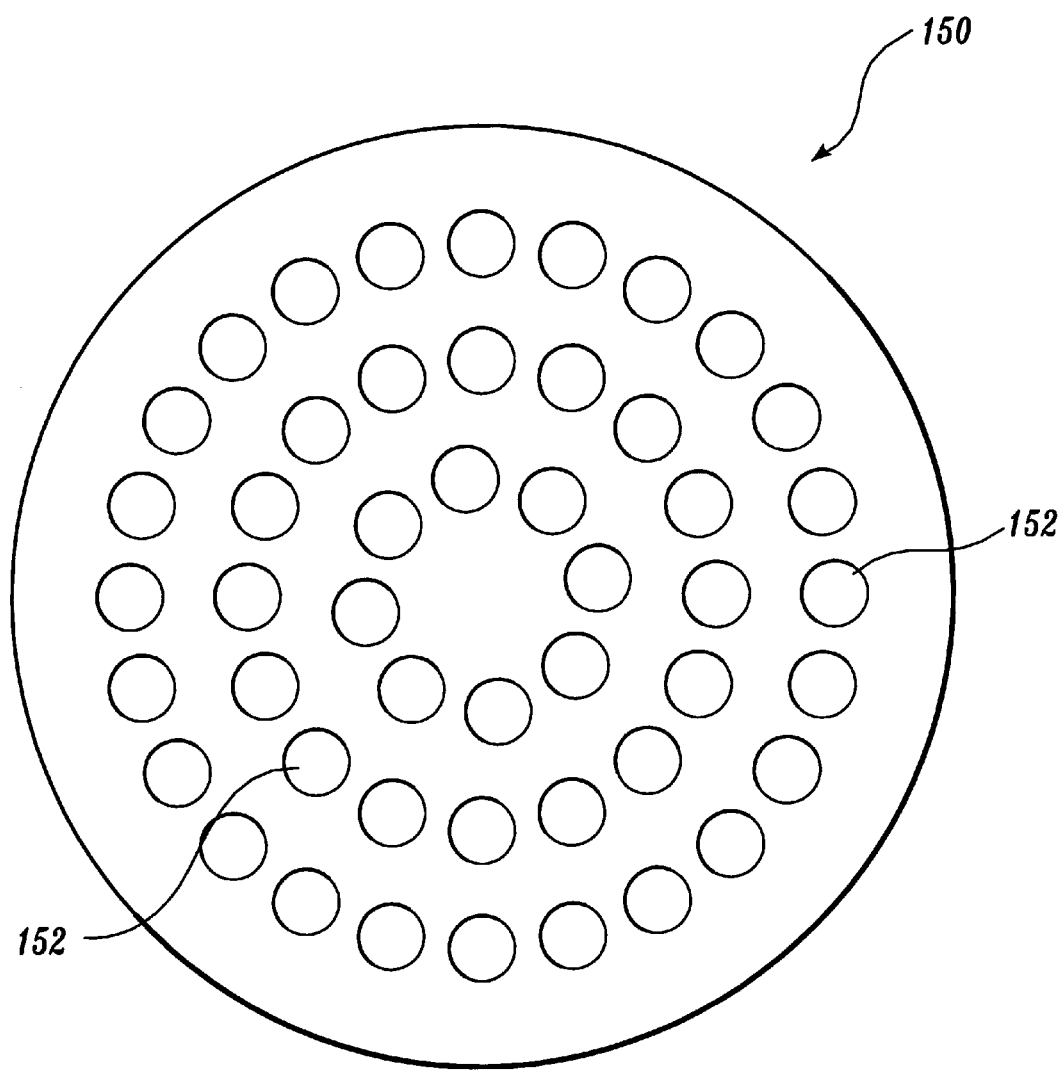
FIG. 2 is a schematic representation of an exemplary carrier having perforations.

FIG. 2 shows a schematic representation of an exemplary carrier 150 having perforations 152. The perforations 152 are shown as circular and are shown in a concentric pattern, but it is understood that the perforations can be of varying shapes and sizes and can be arranged in various patterns. By plugging selected perforations, the user of the CMP system can adjust the distribution of the backside pressure to adjust the polish rate. For example, to increase the polish rate in the central region of the wafer 102, the user plugs the perforations along the perimeter of the carrier 150. The polish rate in the central region of the wafer 102 is increased due to the increase in pressure to the perforations in the central region of the carrier 150 when the perforations along the perimeter are plugged.

Figure 3A:
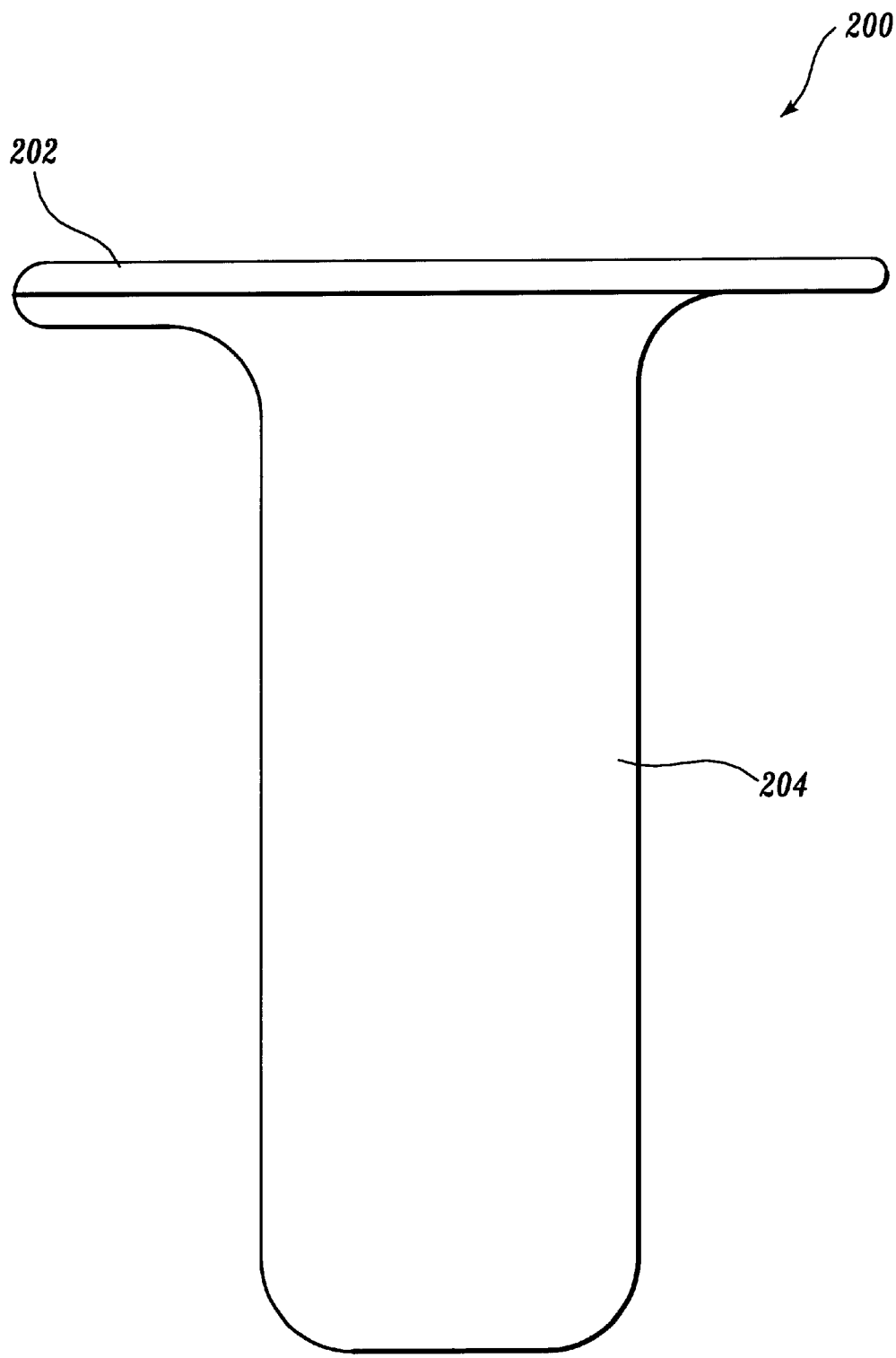
FIG. 3A is a schematic representation of a plug, with a top portion in a closed position, used to plug selected perforations in a carrier of a CMP system according to the present invention.
Figure 3B:
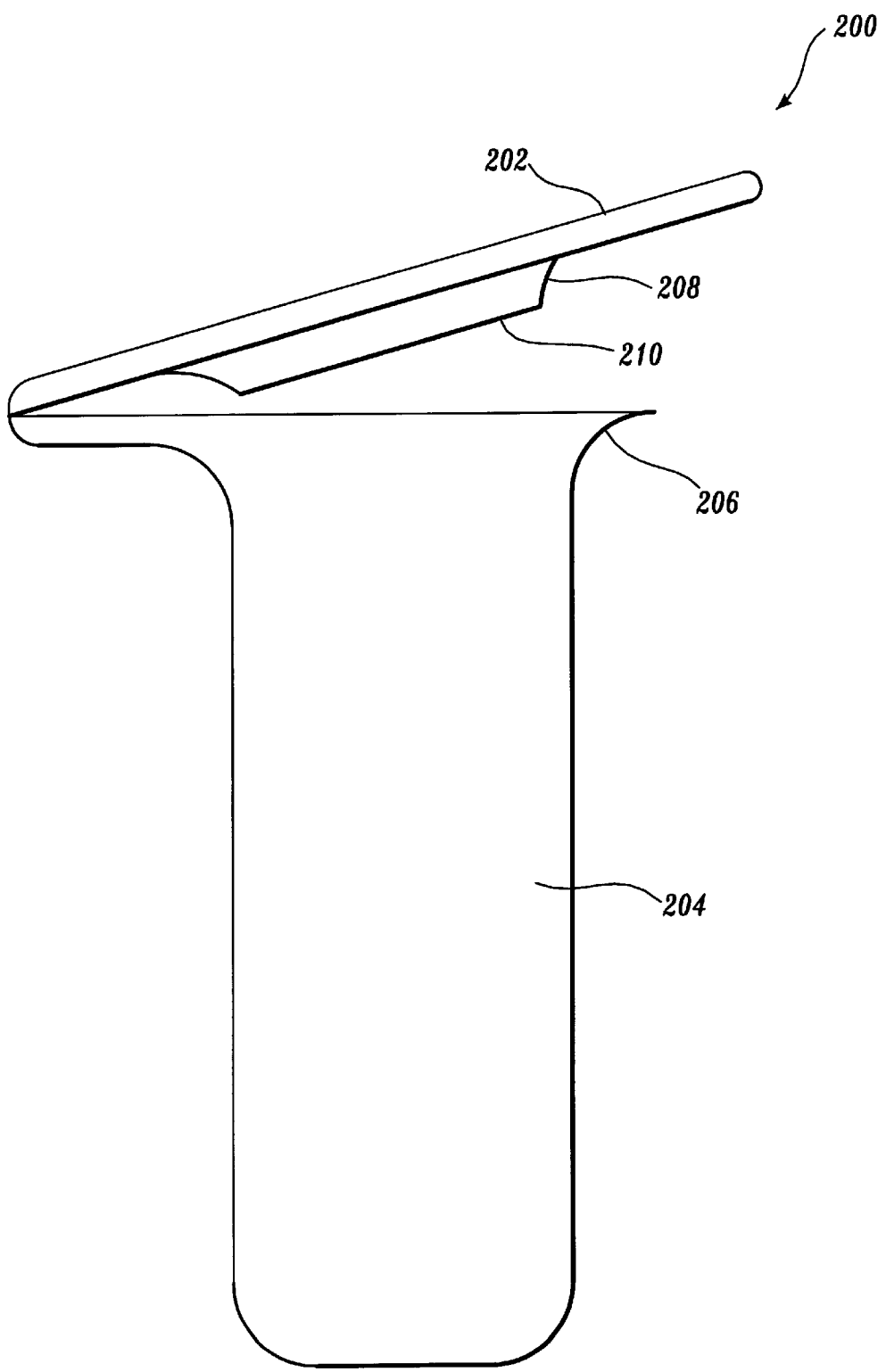
FIG. 3B is a schematic representation of the plug, with the top portion in an open position.

Referring to FIGS. 3A and 3B, the plug 200 has three portions. A top portion 202 is dimensioned to be larger than the perforation. The top portion 202 is preferably disk-shaped. The top portion 202 is preferably about 5 mm in diameter and is preferably about 1 mm in thickness. The top portion 202 is formed of a material that can bear the backside pressure such as Teflon, PVC and PFA.

A bottom portion 204 is cylindrical in shape and is dimensioned to fit snugly into the selected perforations of the carrier. The bottom portion 204 is integrally formed with the top portion 202 and, when in a closed position as shown in FIG. 3A, extends perpendicularly from the top portion 202. The bottom portion 204 is smaller in diameter than the top portion 202 and is dimensioned so as to fit the perforations. The bottom portion 204 includes a flared top 206 to ensure that the plug 200 can be pulled up from the perforation. The bottom portion 204 is preferably formed of materials such as Teflon, PVC, and PFA.

An intermediate portion 208 is preferably tapered. The intermediate portion 208 is dimensioned so as to fit snugly into the bottom portion 204, with a narrower end 210 of the tapered intermediate portion 208 going into the bottom portion 204 first. The intermediate portion 208 is preferably about 0.3 to 0.4 mm in thickness. The intermediate portion 208 is formed of a leak-resistant material to provide a good seal and prevent pressure leakage. For example, the intermediate portion 208 can be formed of materials such as Teflon, PVC and PFA.

While the preferred embodiment of the invention has been illustrated and described, it will be appreciated that various changes can be made therein without departing from the spirit and scope of the invention. For example, the materials forming the plug can be chemical-resistant, if desired. In addition, the top portion can be movably attached to the bottom portion as shown in FIGS. 3A and 3B or can be permanently attached. However, allowing the top portion to open and close as shown in FIGS. 3A and 3B helps in accommodating the change in pressure during and after polishing.

The embodiments of the invention in which an exclusive property or privilege is claimed are defined as follows:

1. In a chemical mechanical polishing system for polishing a semiconductor wafer, the system having a polishing pad, a polishing arm, and a carrier assembly, wherein the carrier assembly has perforations for distributing downward pressure on the semiconductor wafer, a plug for plugging selected perforations comprising:

a pressure-resistant portion;

a bottom portion attached to the pressure-resistant portion; and a leak-resistant portion extending from the pressure-resistant portion, dimensioned to fit snugly into the bottom portion.

2. The plug of claim 1, wherein the leak-resistant portion is tapered.

3. The plug of claim 1, wherein the pressure-resistant portion, the bottom portion, and the leak-resistant portion are formed of Teflon, PVC or PFA.

4. The plug of claim 1, wherein the bottom portion is movably attached to the pressure-resistant portion.

5. The plug of claim 1, wherein the bottom portion includes a flared top.

6. A method for adjusting the distribution of backside pressure in a chemical mechanical polishing system having a polishing pad, a polishing arm, and a carrier assembly, wherein the carrier assembly has perforations for distributing downward pressure on a semiconductor wafer, the method comprising plugging selected perforations in the carrier assembly.

* * * * *